United States Patent
Kim et al.

(10) Patent No.: US 10,658,437 B2
(45) Date of Patent: *May 19, 2020

(54) SEMICONDUCTOR DEVICE HAVING A CARBON CONTAINING INSULATION LAYER FORMED UNDER THE SOURCE/DRAIN

(71) Applicant: SAMSUNG DISPLAY CO., LTD., Yongin-si, Gyeonggi-do (KR)

(72) Inventors: Jaehyun Kim, Yongin-si (KR); Seokhoon Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/366,008

(22) Filed: Mar. 27, 2019

(65) Prior Publication Data

US 2019/0221619 A1 Jul. 18, 2019

Related U.S. Application Data

(63) Continuation of application No. 15/661,375, filed on Jul. 27, 2017, now Pat. No. 10,256,280.

(30) Foreign Application Priority Data

Nov. 7, 2016 (KR) ........................ 10-2016-0147653

(51) Int. Cl.
*H01L 27/32* (2006.01)
*H01L 51/50* (2006.01)
(Continued)

(52) U.S. Cl.
CPC ...... *H01L 27/3244* (2013.01); *H01L 51/5036* (2013.01); *H01L 51/5253* (2013.01);
(Continued)

(58) Field of Classification Search
CPC ............. H01L 27/3211; H01L 27/3213; H01L 27/3244; H01L 27/3246; H01L 27/3248; H01L 51/5036; H01L 51/5253

See application file for complete search history.

(56) References Cited

U.S. PATENT DOCUMENTS 10,256,280 B2 * 4/2019 Kim .................... H01L 27/3244
2013/0059155 A1 3/2013 Choi et al.
(Continued)

FOREIGN PATENT DOCUMENTS

KR 10-1502206 B1 3/2015
KR 10-2015-0035258 A 4/2015
(Continued)

OTHER PUBLICATIONS

European Search Report dated Apr. 11, 2018, of the corresponding European Patent Application No. 17198453.7.

*Primary Examiner* — Hoai V Pham
(74) *Attorney, Agent, or Firm* — Lewis Roca Rothgerber Christie LLP (57) ABSTRACT

An organic light emitting display panel including a first electrode, a second electrode on the first electrode, an organic layer between the first electrode and the second electrode and including at least one light emitting layer, an organic cover layer disposed on the second electrode, a lower layer between the organic cover layer and the second electrode and including a first layer, a second layer, and a third layer, which are different from each other and are sequentially stacked, and an upper layer on the organic cover layer. The first layer contacts the second electrode. The second layer and the third layer each include a silicon compound.

9 Claims, 9 Drawing Sheets (51) Int. Cl.
*H01L 51/52* (2006.01)
*H01L 51/56* (2006.01)

(52) U.S. Cl.
CPC .......... *H01L 51/5275* (2013.01); *H01L 51/56* (2013.01); *H01L 27/3211* (2013.01); *H01L 51/5056* (2013.01); *H01L 51/5072* (2013.01); *H01L 51/5088* (2013.01); *H01L 51/5092* (2013.01); *H01L 51/5265* (2013.01); *H01L 2251/558* (2013.01)

(56) References Cited

U.S. PATENT DOCUMENTS

| | | |
|---|---|---|
| 2014/0070187 A1 | 3/2014 | Cho et al. |
| 2016/0093828 A1 | 3/2016 | Kim et al. |
| 2018/0012947 A1 | 1/2018 | Lee et al. |

FOREIGN PATENT DOCUMENTS

| | | |
|---|---|---|
| KR | 10-2016-0036722 A | 4/2016 |
| KR | 10-2016-0083986 A | 7/2016 |
| WO | WO 2014/041743 A1 | 3/2014 |

\* cited by examiner

SEMICONDUCTOR DEVICE HAVING A CARBON CONTAINING INSULATION LAYER FORMED UNDER THE SOURCE/DRAIN

CROSS-REFERENCE TO RELATED APPLICATIONS

This is a divisional of application Ser. No. 09/047,593 filed Mar. 25, 1998, now U.S. Pat. No. 6,051,509.

This is a continuation application based on pending application Ser. No. 15/661,375, filed Jul. 27, 2017, the entire contents of which is hereby incorporated by reference.

Korean Patent Application No. 10-2016-0147653, filed on Nov. 7, 2016, in the Korean Intellectual Property Office, and entitled: "Display Panel and Method of Manufacturing the Same," is incorporated by reference herein in its entirety.

BACKGROUND

1. Field

The present disclosure herein relates to a display panel and a method of manufacturing the same, and more particularly, to a display panel with a simplified manufacturing process, and a method of manufacturing the same.

2. Description of the Related Art

A display panel displays an image in response to an electric signal, and provides information to a user through the image. A display panel may include various embodiments, e.g., a liquid crystal display panel, an organic light emitting display panel, an electrophoretic display panel, an electro-wetting display panel, and the like.

An organic light emitting display panel has a fast response time, is driven by a low voltage, and includes an organic light emitting diode which is a self-luminous type device. Accordingly, an organic light emitting display panel has many advantages such as being lightweight and thin, since an light source can be omitted, having excellent luminance, having no dependency on the viewing angle, and so on.

An organic light emitting display panel includes a plurality of organic layers and inorganic layers. An organic light emitting display panel can be formed through various manufacturing processes in which multiple layers are formed.

SUMMARY

An embodiment provides an organic light emitting display panel including a first electrode, a second electrode disposed on the first electrode, an organic layer disposed between the first electrode and the second electrode and including at least one light emitting layer, an organic cover layer disposed on the second electrode, a lower layer disposed between the organic cover layer and the second electrode and including a first layer, a second layer, and a third layer, which are different from each other and sequentially laminated, and an upper layer disposed on the organic cover layer, wherein the first layer comes in contact with the second electrode, the second layer and the third layer each include a silicon compound.

An optical path of the second layer is defined by a product of a refractive index of the second layer and the thickness of the second layer, and may be from about 280 Å to about 900 Å range.

In an embodiment, the second layer may have a lower reflective index than the first layer, and the difference between the reflective index of the second layer and the reflective index of the first layer may be equal to or more than 0.2.

In an embodiment, the second layer may include a silicon oxide.

In an embodiment, the thickness of the second layer may be within from about 200 Å to about 600 Å range.

In an embodiment, the third layer may include a silicon oxynitride or silicon nitride.

In an embodiment, the thickness ratio of the third layer to the second layer when the third layer includes a silicon oxynitride may be relatively smaller than the thickness ratio of the third layer to the second layer when the third layer includes a silicon nitride.

In an embodiment, the lower layer may further include a fourth layer which is disposed between the third layer and the organic cover layer and comes in contact with the third layer, wherein the fourth layer may include a silicon compound.

In an embodiment, the fourth layer may have higher oxygen content than the third layer.

In an embodiment, the organic layer may further include a hole control layer disposed between the light emitting layer and the first electrode, and an electron control layer disposed between the light emitting layer and the second electrode, and the first layer may include a host material of the hole control layer or the electron control layer.

In an embodiment, the first electrode may be provided in plurality; the light emitting layer may include a first organic pattern disposed on one first electrode among the plurality of first electrodes and generating a first color light, and a second organic pattern disposed on another first electrode among the plurality of first electrodes and generating a second color light different from the first color; the first organic pattern and the second organic pattern may have thicknesses different from each other; and, out of the second layer, the thickness of a portion overlapping the first organic pattern may be substantially the same as the thickness of a portion overlapping the second organic pattern.

In an embodiment, a method of manufacturing an organic light emitting display panel includes: forming, on a substrate, a first electrode, an organic layer disposed on the first electrode, and a second electrode disposed on the organic layer; forming, on the second electrode, a first layer contacting the second electrode; sequentially laminating, on the first layer, a second layer and a third layer each including a silicon compound; forming an organic cover layer of an organic material on the third layer, forming an upper layer of an inorganic material on the third layer, wherein the second layer and the third layer are formed through the same process.

In an embodiment, the second layer may be formed of a silicon oxynitride.

In an embodiment, the third layer may be formed of a silicon nitride or silicon oxynitride.

In an embodiment, the second layer and the third layer may be each formed by chemical vapor deposition.

In an embodiment, the second layer and the third layer may be continuously formed in the same chamber.

BRIEF DESCRIPTION

Features will become apparent to those of skill in the art by describing in detail exemplary embodiments with reference to the attached drawings in which:

FIG. 6 illustrates a cross-sectional view of a portion of a display panel according to.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1A:
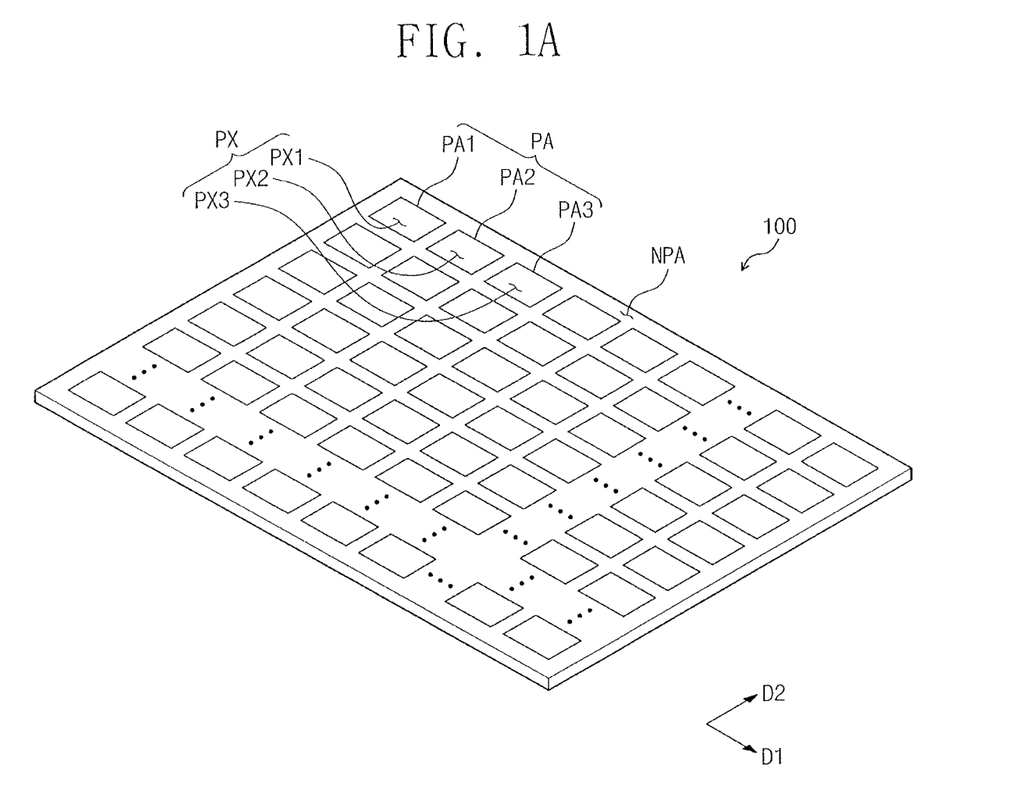
FIG. 1A illustrates a simplified perspective view of a display panel according to an embodiment.
Figure 1B:
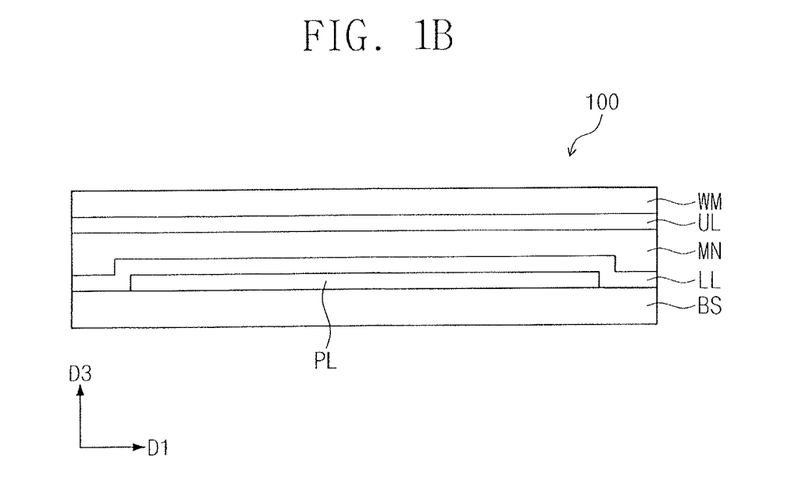
FIG. 1B illustrates a cross-sectional view of a display panel shown in FIG. 1A.
Figure 1C:
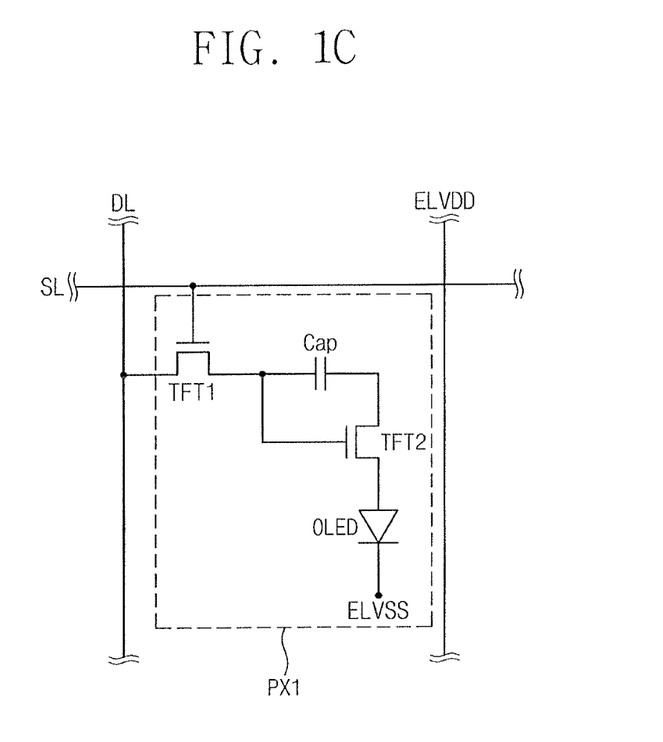
FIG. 1C illustrates an equivalent circuit diagram of a part of the configuration of FIG. 1A.

FIG. 1A is a simplified perspective view showing a display panel according to an embodiment. FIG. 1B is a cross-sectional view of a display panel illustrated in FIG. 1A. FIG. 1C is an equivalent circuit diagram showing a part of the configuration of FIG. 1A. Hereinafter, referring to FIG. 1A to FIG. 1C, the display panel 100 according to an embodiment is explained.

A display panel 100 displays an image generated according to an electric signal. The display panel 100 may include various embodiments. For example, the display panel 100 may be at least one of an organic light emitting display panel, a liquid crystal display panel, an electrophoretic display panel, or an electro-wetting display panel.

However, this is exemplarily described. The display panel 100 according to an embodiment may include various embodiments and is not limited to any particular display panel as long as it displays an image in response to an electric signal. In this embodiment, the display panel 100 is explained using an organic light emitting display panel as an example.

The display panel 100 may include a plurality of pixels PX. The plurality of pixels PX may be arranged in a matrix form on a plane defined by a first direction D1 and a second direction D2. However, this is exemplarily described. The plurality of pixels PX may be arranged in various forms and are not limited to any particular arrangement.

The plurality of pixels PX may include a first pixel PX1, a second pixel PX2, and a third pixel PX3. The first to third pixels PX1 to PX3 may generate light having different colors from each other. For example, the first pixel PX1 may generate a first color light, the second pixel PX2 may generate a second color light, and the third pixel PX3 may generate a third color light.

The display panel 100 may be divided into a plurality of pixel areas and a non-pixel area on a plane. Each of the plurality of pixels PX may be disposed in the plurality of pixel areas. Accordingly, the display panel 100 may implement an image using a combination of light generated though the plurality of pixel areas.

Referring to FIG. 1B, the display panel 100 may include a base substrate BS, a pixel layer PL, a lower layer LL, an organic cover layer MN, an upper layer UL, and a window member WM. The base substrate BS may be an insulation layer. For example, the base substrate BS may be an insulation film, a plastic substrate, or a glass substrate.

The pixel layer PL is disposed on the base substrate BS. The pixel layer PL may include the plurality of pixels PX. For ease of explanation, an equivalent circuit diagram of the first pixel PX1 of FIG. 1A is exemplarily described in FIG. 1C. Meanwhile, each of the plurality of pixels PX according to an embodiment may have a configuration corresponding to the first pixel PX1 and is not limited to any one embodiment.

As shown in FIG. 1C, the first pixel PX1 may include a first transistor TFT1, a capacitor Cap, a second transistor TFT2, and an organic light emitting diode OLED. The first transistor TFT1 may include a control electrode connected to a first signal line SL, an input electrode connected to a second signal line DL, and an output electrode.

The first transistor TFT1 may be a switching device configured to control the on/off of the first pixel PX1. The first transistor TFT1 may transmit or block a data signal transmitted through the second signal line DL in response to a scan signal transmitted through the first signal line SL.

The capacitor Cap includes a first capacitor electrode connected to the first transistor TFT1 and a second capacitor electrode receiving a first power voltage ELVDD. The capacitor Cap charges up to the amount of electric charge corresponding to the difference between the voltages which are corresponding to data signals received from the first transistor TFT1 and the first power voltage ELVDD.

The second transistor TFT2 includes a control electrode connected to the output electrode of the first transistor TFT1 and the first capacitor electrode of the capacitor Cap, an input electrode receiving the first power voltage ELVDD, and an output electrode. The output electrode of the second transistor TFT2 is connected to the organic light emitting diode OLED.

The second transistor TFT2 controls a driving current flowing in the organic light emitting diode OLED corresponding to the amount of electric charge stored in the capacitor Cap. Depending on the amount of electric charge stored in the capacitor Cap, the turn-on time of the second transistor TFT2 is determined. Substantially, the output electrode of the second transistor TFT2 provides the organic light emitting diode OLED with a lower level voltage than the first power voltage ELVDD.

The organic light emitting diode OLED is connected to the second transistor TFT2, and receives a second power voltage ELVSS. The organic light emitting diode OLED emits light during the turn-on period of the second transistor TFT2.

The organic light emitting diode OLED includes a light emitting material. The organic light emitting diode OLED may generate light of a color corresponding to the light emitting material. The color of the light generated in the organic light emitting diode OLED may be one of red, green, blue, or white.

Referring back to FIG. 1B, the lower layer LL is on the pixel layer PL and covers the pixel layer PL, e.g., at least overlaps a top surface of the pixel layer PL in a third direction D3. The lower layer LL may contact, e.g., directly contact, the pixel layer PL. At least a portion of the lower layer LL may cover side surfaces of the pixel layer PL, e.g., may directly contact the side surface. The lower layer LL may extend along an entirety of the side surfaces and may extend along an upper surface of the base substrate BS in a first direction D1. The lower layer LL may include a plurality of thin film layers, as will be described in detail below.

The organic cover layer MN is on the lower layer LL. The organic cover layer MN may include an organic material. The organic cover layer MN may have a relatively large thickness as compared to adjacent layers. For example, the organic cover layer MN may have a thickness larger than the lower layer LL and the upper layer UL, respectively.

The organic cover layer MN may cover the upper surface of the lower layer LL to provide a flat surface on the upper side of thereof. Accordingly, the organic cover layer MN may have different thicknesses depending on the areas thereof. The thickness distribution according to the areas of the organic cover layer MN may be different depending on the condition of the upper surface of the lower layer LL.

The upper layer UL is on the organic cover layer MN. The upper layer UL may be electrically insulated. The upper layer UL may include an inorganic material. For example, the upper layer UL may include a silicon compound.

The upper layer UL covers the organic cover layer MN, e.g., an upper surface thereof, and blocks the contact between the outside and the organic cover layer MN. In addition, the upper layer UL may block moisture and the like generated from the organic cover layer MN from escaping to the outside.

The window member WM is on the upper layer UL. The window member WM may cover the pixel layer PL entirely on a plane, e.g., may overlap the pixel layer PL in the third direction D3. The window member WM may include a material with high transmittance. The window member WM may allow the light generated in the pixel layer PL to be easily seen from the outside, and protects the pixel layer PL from an external impact.

Figure 2:
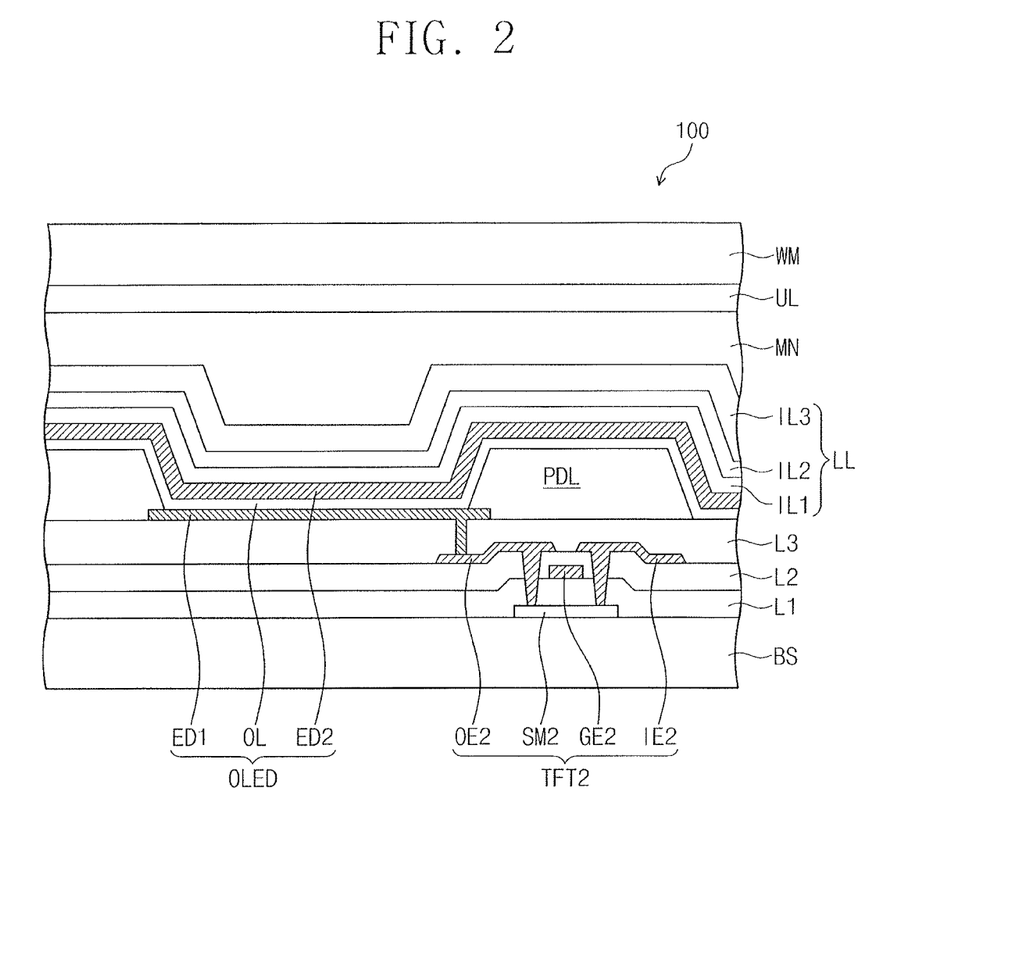
FIG. 2 illustrates a partial cross-sectional view of a display panel according to an embodiment.

FIG. 2 is a partial cross-sectional view of a display panel according to an embodiment. For ease of explanation, FIG. 2 shows an area in which a part of the configurations of the first pixel PX1 shown in FIG. 1C is arranged.

As shown in FIG. 2, the pixel layer PL (see FIG. 1B), may further include a first insulation layer L1, a second insulation layer L2, a third insulation layer L3, and a fourth insulation layer PDL. A semiconductor pattern SM2 of the second transistor TFT2 may be between the first insulation layer L1 and the base substrate BS. A control electrode CE2 of the second transistor TFT2 may be between the first insulation layer L1 and the second insulation layer L2.

In addition, an input electrode IE2 and an output electrode OE2 of the second transistor TFT2 may be between the second insulation layer L2 and the third insulation layer L3. The input electrode IE2 and the output electrode OE2 are spaced apart from each other along the first direction. The input electrode IE2 and the output electrode OE2 may penetrate the first insulation layer L1 and the second insulation layer L2 respectively, to be connected to the semiconductor pattern SM2.

Meanwhile, this is exemplarily described. The second transistor TFT2 according to an embodiment may include the input electrode IE2, the output electrode OE2, the semiconductor pattern SM2, and the control electrode CE2 which are disposed in various positions, and is not limited to any one embodiment.

The organic light emitting diode OLED is on the third insulation layer L3. The organic light emitting diode OLED may include a first electrode ED1, an organic layer OL, and a second electrode ED2 which are sequentially stacked, e.g., laminated, along the third direction D3.

The first electrode ED1 is on the third insulation layer L3. The first electrode ED1 may penetrate the third insulation layer L3 and be connected to the second transistor TFT2. Meanwhile, the first electrode ED1 may be provided in plurality and disposed while being spaced apart from each other, e.g., may be provided for each individual pixel PX.

In an exemplary embodiment, the first electrode ED1 connects to the output electrode OE2. The first electrode ED1 penetrates the third insulating layer L3 and connects to the output electrode OE2 to electrically connect the organic light emitting diode OLED to the second transistor TFT2.

The fourth insulation layer PDL is on the third insulation layer L3. On the fourth insulation layer PDL, a plurality of openings may be defined. Each of the plurality of openings exposes at least portions of the plurality of first electrodes ED1.

The organic layer OL is on the first electrode ED1. The organic layer OL may have a single-layer structure of a single material, a single-layer structure of a plurality of different materials, or a multi-layer structure of multiple layers of a plurality of different materials.

The organic layer OL may include a material emitting light. For example, the organic layer OL may be composed of at least one of the materials emitting red, green, or blue light, and may include a fluorescent material or a phosphor. The organic layer OL may emit light in response to a potential difference between the first electrode ED1 and the second electrode ED2.

Although not shown, the organic layer OL may include a plurality of light emitting patterns each including a different light emitting material. The plurality of light emitting patterns may be disposed to correspond to each of the plurality of first electrodes ED1.

The second electrode ED2 is on the organic layer OL. The second electrode ED2 may face the first electrode ED1. The organic light emitting diode OLED may be connected to the second power voltage ELVSS (see FIG. 1C) through the second electrode ED2.

The lower layer LL may be between the second electrode ED2 and the organic cover layer MN. The lower layer LL may includes a first layer ILL a second layer IL2, and a third layer IL3 which are sequentially laminated along the upper direction.

The first layer IL1 may be disposed directly on the second electrode ED2 and contact the second electrode ED2. The first layer IL1 may include an insulation material. For example, the first layer IL1 may include an organic material or an inorganic material.

The second layer IL2 may be directly on the first layer IL1 and may contact, e.g., directly contact, the first layer ILL. The second layer IL2 may block the penetration of external moisture or oxygen. The second layer IL2 may include an inorganic insulation material. For example, the second layer IL2 may include a silicon compound.

The third layer IL3 may be directly on the second layer IL2 and may contact, e.g., directly contact, the second layer IL2. The third layer IL3 may block the penetration of external moisture or oxygen.

The third layer IL3 may include an inorganic insulation material. For example, the third layer IL3 may include a silicon compound. In this case, a silicon compound constituting the third layer IL3 and a silicon compound constituting the second layer IL2 may be different from each other.

The organic cover layer MN may be directly on the lower layer LL and may contact, e.g., directly contact, the lower layer LL. The organic cover layer MN may contact the top layer of the lower layer LL, e.g., the third layer IL3.

As described above, the organic cover layer MN provides a flat surface on the upper side thereof. Accordingly, the curvature occurring on the upper surface of the lower layer LL or a particle present on the lower layer LL may be covered by the organic cover layer MN, and therefore, the upper layer UL may be stably formed on a flat surface. In addition, the organic cover layer MN may alleviate the stress among layers contacting each other.

The organic cover layer MN may include an organic material. For example, the organic cover layer MN may include a resin or a polymer.

The upper layer UL may be directly on the organic cover layer MN and contact the organic cover layer MN. The upper layer UL may block the penetration of external moisture or oxygen. The upper layer UL may include an inorganic insulation material. For example, the upper layer UL may include a silicon compound.

The window member WM may be disposed on the organic cover layer MN. The window member WM may cover the organic cover layer MN and protect the organic light emitting layer OLED from an external impact.

Each of the second layer IL3 and the third layer IL3 of the lower layer LL of the display panel 100 according to an embodiment may include a silicon compound. Accordingly, the second layer IL2 and the third layer IL3 may be formed through substantially the same process, and therefore, the processing cost can be reduced and the process can be simplified. A detailed explanation thereof will be described later.

Figure 3:
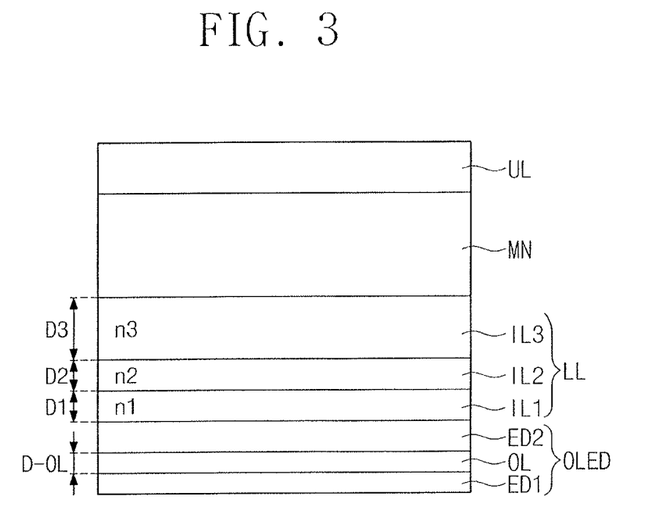
FIG. 3 illustrates a cross-sectional view of a portion of a display panel according to an embodiment.
Figure 4:
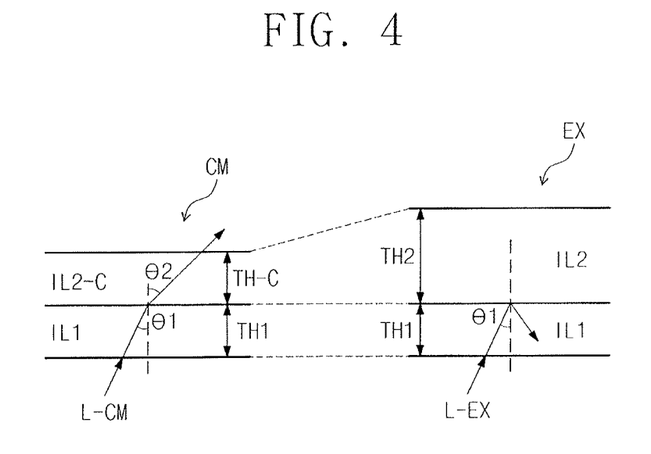
FIG. 4 illustrates a cross-sectional view of a part of an optical path of a display panel according to an embodiment.

FIG. 3 is a cross-sectional view showing a portion of a display panel according to an embodiment. FIG. 4 is a cross-sectional view showing a part of an optical path of a display panel according to an embodiment. For ease of explanation, a comparative example CM and an example EX according to embodiments are shown at the same time. Hereinafter, referring the FIG. 3 and FIG. 4, a display panel according to an embodiment is explained.

As shown in FIG. 3, the first electrode ED1 and the second electrode ED2 of the organic light emitting diode OLED may be spaced apart at a predetermined interval. A separation distance between the first electrode ED1 and the second electrode ED2 may correspond to a thickness of the organic layer D-OL.

In this embodiment, the organic light emitting diode OLED may have a resonance structure. Accordingly, the thickness of the organic layer D-OL may be an integer multiple of the half wavelength of light generated from the organic layer OL.

A portion of light generated by the organic layer OL may be reflected at an interface between the first electrode EDI and the organic layer OL, and at an interface between the second electrode ED2 and the organic layer OL, to resonate inside the organic light emitting diode OLED. Accordingly, the organic light emitting diode OLED may have improved light efficiency by controlling the thickness of the organic layer D-OL.

The first and third layers IL1 to IL3 may have different predetermined refractive indexes n1 to n3. For example, the first layer IL1 may have a first refractive index n1, the second layer IL2 may have a second refractive index n2, and the third layer IL3 may have a third refractive index n3.

The second refractive index n2 may be less than the first refractive index n1. Accordingly, a portion of light generated from the organic layer OL may reach an interface between the first layer IL1 and the second layer IL2, be easily reflected from the interface, and re-enter the organic light emitting diode OLED.

The re-entered light may be resonated by the first electrode ED1 and the second electrode ED2, and be emitted to the outside with improved intensity. Accordingly, a display panel according to an embodiment may have improved light extraction efficiency by controlling a refractive index of the second layer IL2.

An optical path of the second layer IL2 may be in a range of from about 280 Å to about 900 Å. The optical path of the second layer IL2 is a distance which incident light on the second layer IL2 passes through the vacuum within a unit time, and may be defined by the product of the second refractive index n2 and a thickness of the second layer D2.

When the second layer IL2 includes a silicon oxide, the thickness of the second layer D2 may be equal to or greater than about 200 Å and may be equal to or less than about 600 Å. When the second layer IL2 includes a silicon oxide, the second refractive index n2 may be from about 1.4 to 1.5. In this case, a portion of light incident on an interface between the first layer IL1 and the second layer IL2 is reflected again. Therefore, the light efficiency may be improved. However, this is exemplarily described. The thickness of the second layer D2 may vary depending on the second refractive index n2.

Referring to FIG. 4 in more detail, layers constituting the comparative example CM and the example EX may have the same refractive index but different thicknesses from each other. More specifically, the first layer IL1 of the comparative example CM may be formed of the same material and have the same thickness TH1 as the first layer IL1 of the example EX. That is, the first layer IL1 of the comparative example CM may be substantially the same layer as the first layer IL1 of the example EX.

A second layer IL2-C of the comparative example CM may be formed of the same material and have a different thickness as the second layer IL2 of the example EX. The thickness TH2 of the second layer IL2 of the example EX may be smaller than the thickness TH-C of the second layer IL2-C of the comparative example CM. The thickness TH2 of the second layer IL2 of the example EX may be a numeral value satisfying the condition of the optical path of the second layer IL2.

In this case, incident light L-CM to the comparative example CM passes through the first layer IL1 and is incident at a first angle $\Theta 1$ with an interface of the second layer IL2-C and the first layer IL1. At least a part of the incident light may pass through the second layer IL2-C at a second angle Θ2 and be emitted to the outside.

That is, although there is a change in a light path in the comparative example CM, most of the incident light L-CM passes through the second layer IL2-C and is emitted. Accordingly, the intensity of light which is visible from an outer side of the second layer IL2 may be the same or less than the intensity of light which passes through the second layer IL2-C.

Meanwhile, incident light L-EX in the example EX passes through the first layer IL1 and is incident at the first angle Θ1 with an interface of the second layer IL2 and the first layer ILE The incident light L-EX may correspond to the incident light L-CM which is incident to the comparative example CM.

However, hereinafter, the incident light L-EX in the example EX does not pass through the second layer IL2, but is reflected from an interface of the second layer IL2 and the first layer IL1. In this case, the difference between the second refractive index n2 and the first refractive index n1 may be equal to or greater than 0.2. The difference of the second refractive index n2 and the first refractive index n2 and the reflection efficiency from the interface of the second layer IL2 and the first layer IL1 may be substantially proportional.

The light reflected from an interface of the second layer IL2 and the first layer IL1 may pass through the first layer IL1 and re-enter the organic light emitting diode OLED under the first layer IL1. The re-entered light may resonate inside the organic light emitting diode OLED, be emitted from the organic light emitting diode OLED with improved intensity, and be visible from the outside.

The display panel 100 according to an embodiment may improve light efficiency by controlling the optical path of the second layer IL2. In addition, by controlling the optical path of the second layer IL2, the display panel 100 may generate improved light extraction efficiency through controlling a thickness while applying a layer with the same refractive index.

Referring back to FIG. 3, the third layer IL3 may have a higher refractive index than the refractive index of the second layer IL2. That is, the second refractive index n2 may be less than the third refractive index n3. Accordingly, the light incident to an interface of the second layer IL2 and the third layer IL3 may not be reflected but pass through the third layer IL3 and be emitted to the outside.

As described above, the third layer IL3 includes a silicon compound. The silicon compound constituting the third layer IL3 may be different from the silicon compound constituting the second layer IL2. For example, the third layer IL3 may include a silicon oxynitride (SiON) or silicon nitride (SiNx).

The second layer IL2 and the third layer IL3 may be formed through the same process. Specifically, each of the second layer IL2 and the third layer IL3 may be formed by chemical vapor deposition.

Meanwhile, the second layer IL2 and the third layer IL3 may be consecutively formed in the same chamber. Each of the second layer IL2 and the third layer IL3 includes a silicon compound, and therefore, each of the second layer IL2 and the third layer IL3 may be formed by controlling injected plasma.

For example, the second layer IL2 including silicon oxide may be formed in the same chamber using plasma with high oxygen content, and the third layer IL3 including silicon nitride or silicon oxynitride may be consecutively formed in the same chamber using plaza with relatively high nitrogen content. Accordingly, an interface between the second layer IL2 and the third layer IL3 according to an embodiment may be formed relatively unclearly by continuous deposition than by discontinuous deposition.

A method for manufacturing a display panel according to an embodiment may include forming the second layer IL2 and the third layer IL3 through the same process, thereby simplifying the process. In addition, according to an embodiment, the second layer IL2 and the third layer IL3 may be formed consecutively in the same chamber. Therefore, processing time and cost may be reduced.

The thickness of the third layer D3 may be larger than the thickness of the second layer D2. For example, the thickness of the third layer D3 may be equal to or greater than 5,000 Å and equal to or less than 10,000 Å. Accordingly, for the sake of optical control, the thickness portion limited by the second layer IL2 is compensated by the thickness of the third layer IL3, and therefore, the lower layer LL may secure enough thickness to serve as a barrier.

In a display panel according to an embodiment, the thickness of the third layer D3 may be provided variously according to a material constituting the third layer IL3. For example, as for the same second layer IL2, the thickness of the third layer D3 composed of silicon nitride may be smaller than the thickness of the third layer D3 composed of silicon oxynitride. According to an, by controlling a material of the third layer IL3, the thickness D3 of the third layer IL3 may be varied and the processing time may be reduced easily.

Figure 5A:
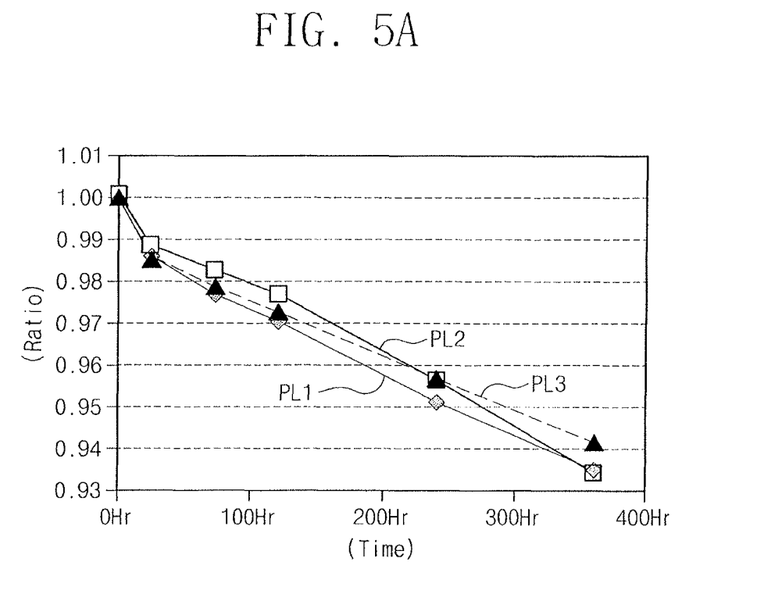
FIG. 5A illustrates a graph of a luminance life of a display panel according to an embodiment.
Figure 5B:
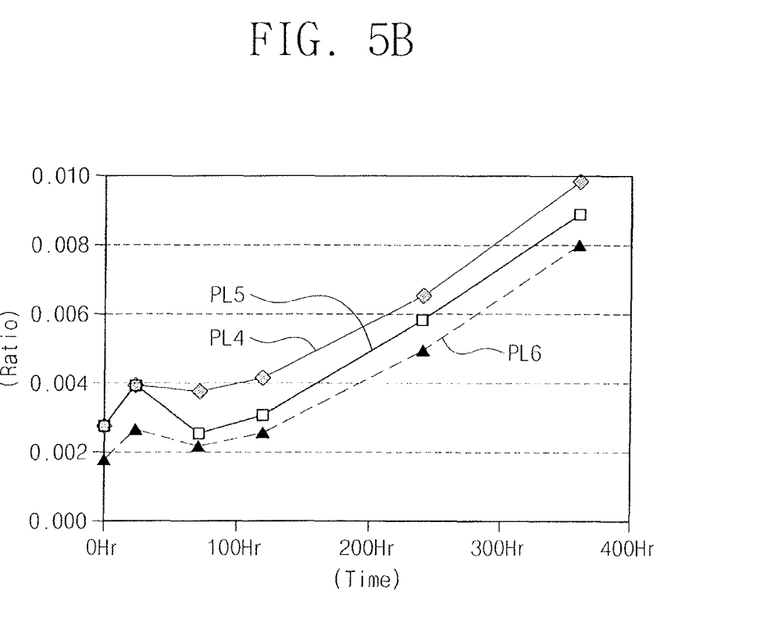
FIG. 5B illustrates a graph of a color life of a display panel according to an embodiment.

FIG. 5A is a graph showing a luminance life of a display panel according to an embodiment. FIG. 5B is a graph showing a color life of a display panel according to an embodiment. In FIG. 5A and FIG. 5B, a comparative example and a first example and a second example are shown for ease of the explanation.

The comparative example, the first example, and the second example may be embodiments which are have the same structure except for different configurations of the lower layer LL. In the comparative example, the first example, and the second example, the first layer IL1 may be the same, but the second layer IL2 and the third layer IL3 thereof may be different from each other.

For the comparative example, the second layer IL2 includes lithium fluoride (LiF) and the third layer IL3 thereof includes silicon oxynitride. For the first example, the second layer IL2 includes silicon oxide and the third layer IL3 thereof includes silicon oxynitride. That is, the first example has a different constituent material of the second layer IL2 than the comparative example. For the second example, the second layer IL2 includes silicon oxide and the third layer IL3 thereof may include silicon nitride. That is, the second example has a different constituent material of the third layer IL3 than the first example. Hereinafter, referring to FIG. 5A and FIG. 5B, a display panel according to an embodiment is explained.

In FIG. 5A, a first graph PL1 shows the luminance life of the comparative example, a second graph PL2 shows the luminance life of the first example, and a third graph PL3 shows the luminance life of the second example. A shown in the first to third graphs PL1 to PL3, a luminance ratio on an initial luminance is gradually reduced as time goes by.

In this case, the first to third graphs PL1 to PL3 shows substantially a similar pattern. Specifically, the second graph PL2 and the third graph PL3 show a substantially improved luminance ratio at the same elapsed time. That is, even when the LiF of the second layer IL2 is substituted by a layer including a silicon compound, at least an equivalent luminance life property thereof is realized.

Referring to the second graph PL2 and the third graph PL3, the third graph PL3 has a gentler slope than the second graph PL2. Accordingly, at the same elapsed time, the third graph PL3 has a bigger luminance ratio than the second graph PL2. That is, the second example including silicon nitride may have an improved luminance life than the first example including silicon oxynitride.

In FIG. 5B, a fourth graph PL4 shows a color life of the comparative example, a fifth graph PL5 shows a color life of the first example, and a sixth graph PL6 shows a color life of the second example. A color life is related to a phenomenon in which an afterimage from the time light has been emitted remains because a device has been continuously damaged by heat in a driving process, and therefore, is also related to a life of the device. Accordingly, as shown in the fourth to sixth graphs PL4 to PL6, a ratio of an initial color remains substantially increases as time goes by.

In this case, among the fourth to sixth graphs, the fifth and sixth graphs PL5 and PL6 are shown to have a relatively low color remaining ratio than the fourth graph PL4 at the same elapsed time. That is, the first and second examples have a relatively improved color life than the comparative example.

Referring to the fifth graph PL5 and the sixth graph PL6, the second example shown through the sixth graph PL6 has an improved color life that the first example shown through the fifth graph PL5. That is, an example including the third layer LI3 composed of silicon nitride has a more improved color life than an example including the third layer IL3 composed of silicon oxynitride.

A display panel according to an embodiment has an advantage in that the second layer IL2 and the third layer IL3 respectively are composed of a silicon compound, and therefore, may be formed using the same process. In addition, as shown in FIG. 5A and FIG. 5B, a display panel according to an embodiment may also have an excellent property in a life of a device because at least equivalent color life and luminance life can be secured as in the case in which the second layer IL2 composed of lithium fluoride (LiF). Therefore, in this embodiment the display panel which has the excellent property may be formed without adding step of forming lithium fluoride layer. Therefore, manufacturing the display panel may be simplified. Also, a display panel according to an embodiment may properly control properties of a life of a device or an aftermath image by choosing various materials among silicon compounds.

Figure 6:
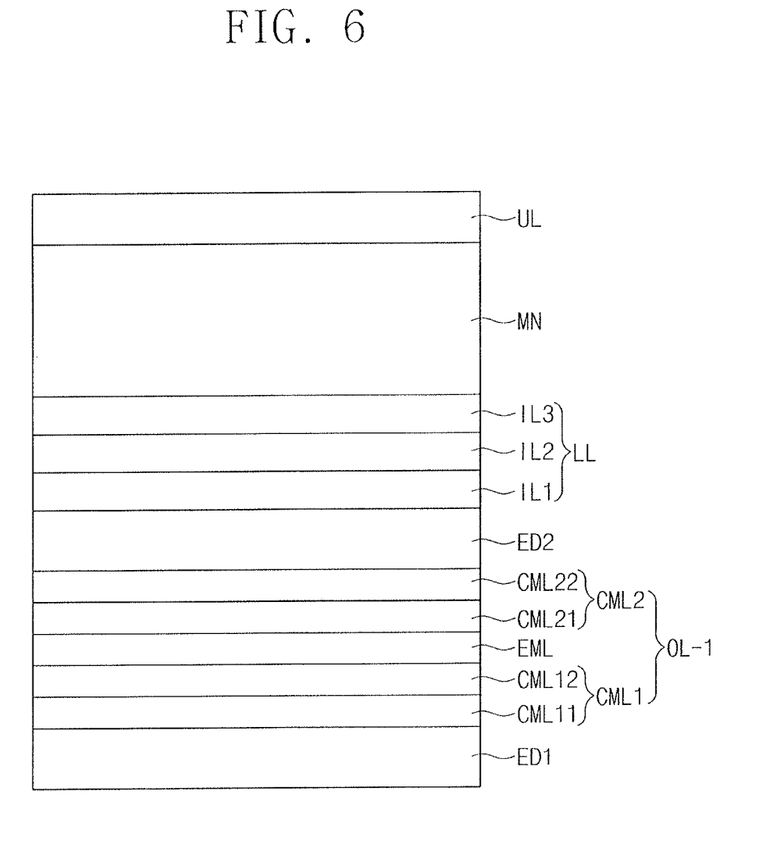

FIG. 6 is a cross-sectional view showing a portion of a display panel according to an embodiment. The same configurations as the configurations explained in FIG. 1A to FIG. 5B are given the same reference numerals, and duplicate explanations are omitted.

As shown in FIG. 6, the organic layer OL may include a plurality of layers. For example, the organic layer OL may include a first charge control layer CML1, a light emitting layer EML, and a second charge control layer CML2.

The light emitting layer EML generates a first color light. The light emitting layer EML may include at least one of an organic light emitting material and an inorganic light emitting material. In addition, the light emitting layer EML may include a phosphor or a fluorescent material.

The first charge control layer CML1 may be composed of a single layer or multiple layers. In this embodiment, the first charge control layer CML1 ma include a first charge injection layer CML11 and a first charge transfer layer CML12.

Each of the first charge injection layer CML11 and the first charge transfer layer CML12 may facilitate a charge transfer from the first electrode ED1 to the light emitting layer EML. A charge may be a hole or an electron, and may be determined according to a driving method of an organic light emitting diode.

The second charge control layer CML2 may be composed of a single layer or multiple layers. In this embodiment, the second charge control layer CML2 may include a second charge injection layer CML21 and a second charge transfer layer CML22.

Each of the second charge injection layer CML21 and the second charge transfer layer CML22 may facilitate a charge transfer from the second electrode ED2 to the light emitting layer EML. A charge may be a hole or an electron, and may have an opposite polarity to a charge transferring from the first electrode ED1.

Each of the first charge control layer CMLI and the second charge control layer CML2 may include a host and a dopant. The host material and the dopant material may vary according to a charge which each of the first charge control layer CML1 and the second charge control layer CML2 transfers.

The first layer IL1 of the lower layer LL may include at least one host material between the first charge control layer CML1 and the second charge control layer CML2. Accordingly, the first layer IL1 may utilize a material for providing the organic layer OL, and therefore, the processing cost may be reduced. However, this is an exemplarily described. The first layer IL1 may be formed of an inorganic insulation material, and is not limited to any particular material.

The distance from the interface between the first electrode ED1 and the organic layer OL to the interface between the second electrode ED2 and the organic layer OL may be defined by the light emitting layer EML, the first charge control layer CML1, and the second charge control layer CML2. The distance from the interface between the first electrode ED1 and the organic layer OL to the interface between the second electrode ED2 and the organic layer OL may be a distance in which the first color light generated by the light emitting layer EML can resonate. Accordingly, a display panel according to an embodiment may improve the light efficiency of an organic light emitting diode by controlling the thickness and the number of multiple layers composing the organic layer OL.

Figure 7A:
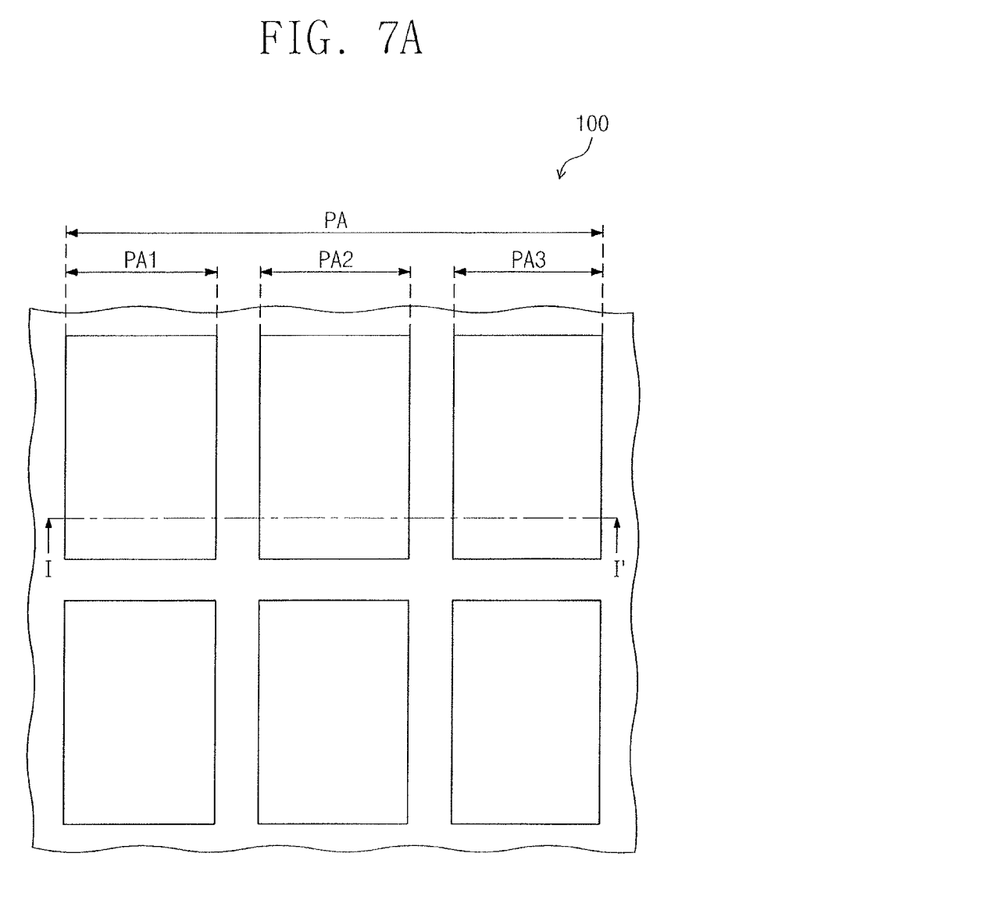
FIG. 7A illustrates a plan view of a portion of a display panel according to an embodiment.
Figure 7B:
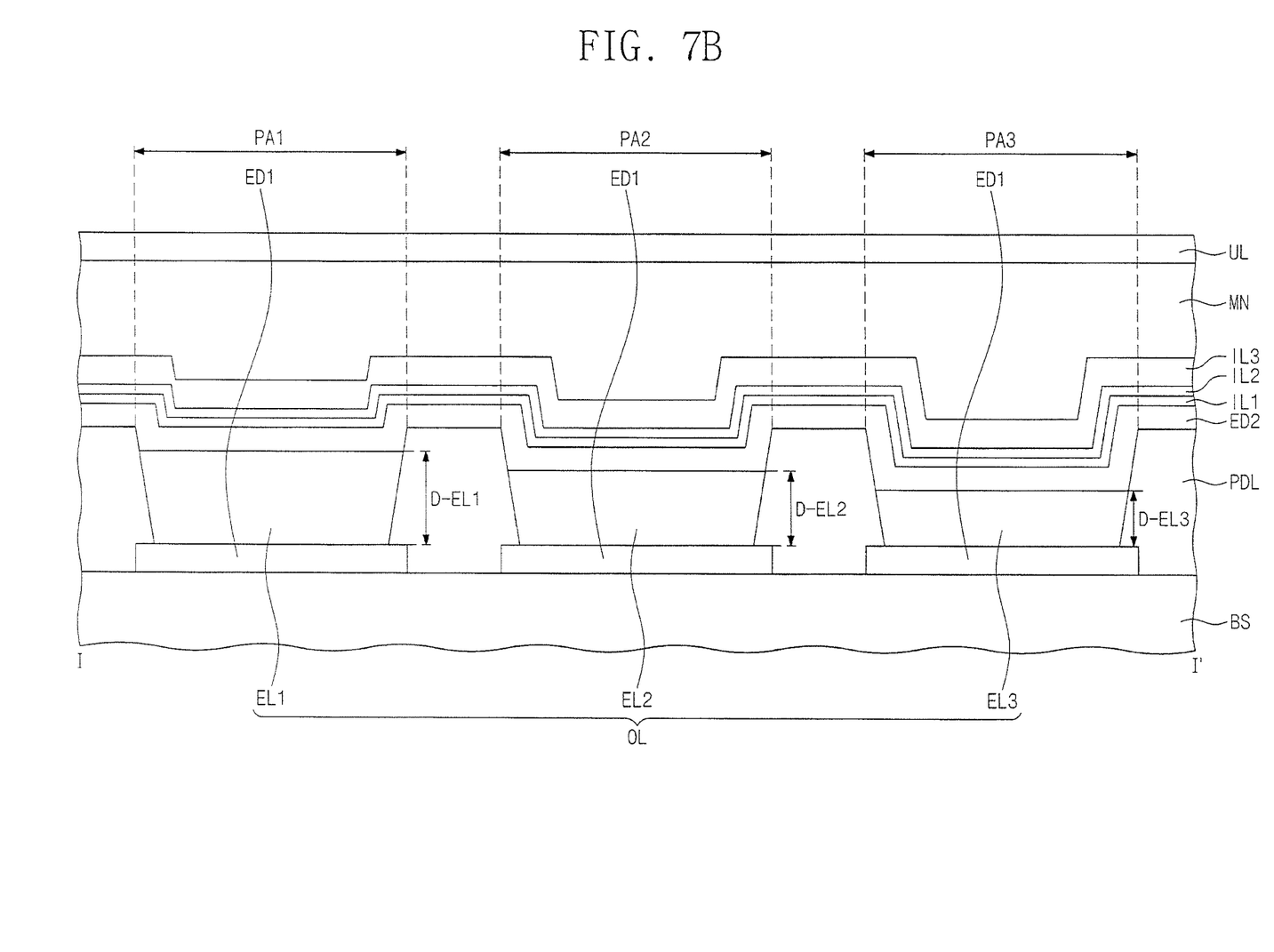
FIG. 7B illustrates cross-sectional view along I-I' in FIG. 7A.

FIG. 7A is a plan view showing a portion of a display panel according to an embodiment. FIG. 7B is cross-sectional view along I-I' illustrated in FIG. 7A. In FIG. 7B, some of the details are omitted for ease of explanation.

Hereinafter, referring to FIG. 7A and FIG. 7B, the display panel 100 according to an embodiment is explained. Meanwhile, the same configurations as the configurations explained in FIG. 1A to FIG. 6 are given the same reference numerals, and duplicate explanations are omitted.

As shown in FIG. 7A, the pixel area PA may include a first pixel area PA1, a second pixel area PA2, and a third pixel area PA3. The first pixel area PA1, the second pixel area PA2, and the third pixel area PA3 may be areas sequentially arranged along one direction.

Each of the first pixel area PA1, the second pixel area PA2, and the third pixel area PA3 may generate light having different colors from each other. For example, a first color light is generated in the first pixel area PA1, a second color light is generated in the second pixel area PA2, and a third color light is generated in the third pixel area PA3.

Specifically, as shown in FIG. 7B, the organic layer may include a first to third light emitting patterns EL1 to EL3 each disposed in the first pixel area PA1, the second pixel area PA2, and the third pixel area PA3. The first color light may be generated from the first light emitting pattern EL1. The second color light may be generated from the second light emitting pattern EL2 and the third color light may be generated from the third light emitting pattern EL3.

Each of the first to third light emitting patterns EL1 to EL3 may be designed to have different thicknesses from each other. For example, the first light emitting pattern EL1 may be designed to have a first thickness D-EL1, the second light emitting pattern EL2 may be designed to have a second thickness D-EL2, and the third light emitting pattern EL3 may be designed to have a third thickness D-EL3.

Each of the first to third thicknesses D-EL1 to D-EL3 may be a distance in which light generated from corresponding light emitting pattern can resonate. In this embodiment, among the first to third color light, a case in which the wavelength of the first color light is the longest and the wavelength of the third color light is the shortest is exemplarily described. Accordingly, it is possible to design that, among the first to third thicknesses D-EL1 to D-EL3, the first thickness D-EL1 is the biggest and the third thickness D-EL3 is the smallest.

As shown in FIG. 7B, the second electrode ED2, the first layer IL1, the second layer IL2, and the third layer IL3 on the organic layer OL may have substantially the identical thickness in the first to third pixel areas PA1 to PA3.

Since each of the second layer IL2 and the third layer IL3 includes a silicon compound, each of the second layer IL2 and the third layer IL3 may have an upper surface reflecting on a surface shape of a layer disposed thereunder. Accordingly, the upper surface of the third layer IL3 may define an uneven surface in the first pixel area PA1, the second pixel area PA2, and the third pixel area PA3.

The organic cover layer MN according to an embodiment may cover the upper surface of the third layer IL3 and provide a flat surface on the upper side thereof. The organic cover layer MN may substantially compensate the difference in thickness of each of the first to third light emitting patterns EL1 to EL3. Accordingly, the upper layer UL disposed on the organic cover layer MN may be formed stably on a flattened surface.

The display panel 100 according to an embodiment, the first layer IL1, the second layer IL2, and the third layer IL3 may be commonly disposed on the plurality of pixel areas PA1 to PA3 which emit light with different colors, and improve light efficiency of each of the plurality of pixel areas PA1 to PA3. Accordingly, the identical lower layers can be applied to the plurality of pixel areas PA1 to PA3, and therefore, the process may be simplified.

Figure 8:
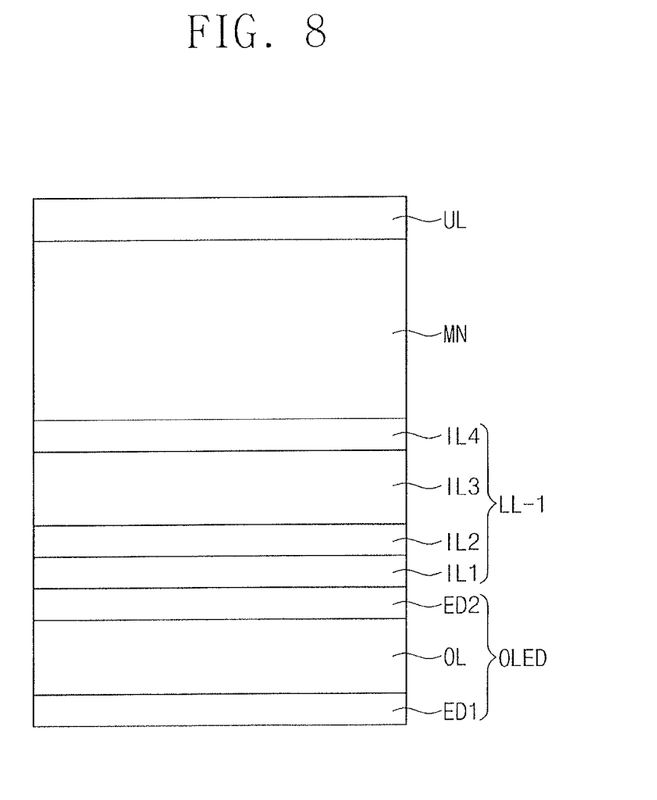
FIG. 8 illustrates a cross-sectional view of a portion of a display panel according to an embodiment.

FIG. 8 is a cross-sectional view showing a portion of a display panel according to an embodiment. Referring to FIG. 8, a display panel according to an. Meanwhile, the same elements as the configurations explained in FIG. 1A to FIG. 7B are given the same reference numerals, and duplicate explanations are omitted.

As shown in FIG. 8, a lower layer LL-1 may include a fourth layer IL4. The fourth layer IL4 may be on the third layer IL3 and be the uppermost layer. Accordingly, the organic cover layer MN may directly contact the fourth layer IL4 and form a predetermined interface.

The fourth layer IL4 may include silicon oxynitride. When the third layer IL3 includes silicon oxynitride, silicon oxynitride of the fourth layer IL4 may have higher oxygen content than silicon oxynitride included in the third layer IL3. Accordingly, even if the third layer IL3 and the fourth layer IL4 included the identical material, the third layer IL3 and the fourth layer IL4 may be layers which are substantially distinguishable.

The fourth layer IL4 may protect the third layer IL3. The fourth layer IL4 may prevent the third layer IL3 from being damaged in a process for providing the organic cover layer MN. A display panel according to an embodiment may improve process reliability by including the lower layer LL-1 which further includes the fourth layer IL4.

According to the present embodiment, a manufacturing process of a display panel may be simplified and a processing cost of a display panel may be reduced since a plurality of layers may be included which can be formed in a same process. In addition, light efficiency and life of a display panel may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display panel, comprising:
   a first electrode;
   a second electrode on the first electrode;
   an organic layer between the first electrode and the second electrode and the organic layer including a light emitting layer;
   an organic cover layer on the second electrode;
   a lower layer between the organic cover layer and the second electrode, wherein the lower layer including a first layer, a second layer and a third layer, which are different from each other and are sequentially stacked; and
   an upper layer on the organic cover layer, and
   wherein each of the second layer and the third layer includes a silicon compound, and the first layer dose not include a silicon compound.

2. The organic light emitting display panel as claimed in claim 1, wherein the third layer includes silicon oxynitride or silicon nitride.

3. The organic light emitting display panel as claimed in claim 1, wherein a thickness of the second layer is within from about 200Å to about 600Å range and a thickness of the third layer is within from about 5000Å to about 10000Å.

4. The organic light emitting display panel as claimed in claim 1, wherein a refractive index of the second layer is different from a refractive index of the third layer.

5. The organic light emitting display panel as claimed in claim 1, wherein the upper layer includes a silicon compound.

6. The organic light emitting display panel as claimed in claim 1, wherein the first layer is between the second layer and the second electrode, and wherein the first layer contacts the second electrode.

7. The organic light emitting display panel as claimed in claim 6, wherein the first layer includes a material of the organic layer.

8. The organic light emitting display panel as claimed in claim 1, wherein the second layer includes silicon oxide.

9. The organic light emitting display panel as claimed in claim 1, wherein second layer has a lower reflective index than the first layer, and a difference between the reflective index of the second layer and the reflective index of the first layer is equal to or greater than 0.2.

\* \* \* \* \*

UNITED STATES PATENT AND TRADEMARK OFFICE
CERTIFICATE OF CORRECTION

PATENT NO. : 10,658,437 B2  
APPLICATION NO. : 16/366008  
DATED : May 19, 2020  
INVENTOR(S) : Jaehyun Kim et al.

Page 1 of 1

It is certified that error appears in the above-identified patent and that said Letters Patent is hereby corrected as shown below:

In the Claims  
Column 14, Line 42, Claim 1         delete "dose" and insert -- does --

Signed and Sealed this  
Twenty-fifth Day of May, 2021

Drew Hirshfeld  
*Performing the Functions and Duties of the*  
*Under Secretary of Commerce for Intellectual Property and*  
*Director of the United States Patent and Trademark Office*